(12) United States Patent
Rofougaran et al.

(10) Patent No.: US 7,933,568 B2
(45) Date of Patent: Apr. 26, 2011

(54) METHOD AND SYSTEM FOR MITIGATING RECEIVER SATURATION DURING SIMULTANEOUS FM TRANSMISSION AND RECEPTION

(75) Inventors: Ahmadreza Rofougaran, Newport Coast, CA (US); Maryam Rofougaran, Rancho Palos Verde, CA (US)

(73) Assignee: Broadcom Corporation, Irvine, CA (US)

( * ) Notice: Subject to any disclaimer, the term of this patent is extended or adjusted under 35 U.S.C. 154(b) by 846 days.

(21) Appl. No.: 11/752,754

(22) Filed: May 23, 2007

(65) Prior Publication Data

US 2008/0233910 A1    Sep. 25, 2008

Related U.S. Application Data

(60) Provisional application No. 60/895,698, filed on Mar. 19, 2007.

(51) Int. Cl.
*H04B 1/04* (2006.01)
*H04K 3/00* (2006.01)

(52) U.S. Cl. .............. 455/126; 455/69; 455/127.1

(58) Field of Classification Search .............. 455/69, 455/126, 127.1–127.2, 232.1–235.1, 240.1, 455/241.1, 253.1, 522
See application file for complete search history.

(56) References Cited

U.S. PATENT DOCUMENTS

| 5,129,098 | A | * | 7/1992 | McGirr et al. | 455/69 |
| 6,356,745 | B1 | * | 3/2002 | Lee et al. | 455/232.1 |
| 7,010,330 | B1 | * | 3/2006 | Tsividis | 455/574 |
| 2006/0030359 | A1 | * | 2/2006 | Behzad et al. | 455/556.1 |

* cited by examiner

*Primary Examiner* — Lee Nguyen
(74) *Attorney, Agent, or Firm* — McAndrews, Held & Malloy, Ltd.

(57) ABSTRACT

Aspects of a method and system for mitigating receiver saturation during simultaneous FM transmission and reception may include detecting a power of an RF signal received at an antenna. A power of one or more baseband signal components corresponding to the RF signal may be determined. A power of signals transmitted via the antenna may be controlled, based on a cost function derived from at least the detected RF signal power received and/or the determined power of the one or more baseband signal components. One or more of the baseband signal components may be an in-phase signal, a quadrature signal or both an in-phase signal and a quadrature signal associated with a same carrier frequency. In one embodiment of the invention, the radio frequency signal may be an intermediate frequency (IF) radio signal.

30 Claims, 4 Drawing Sheets

METHOD AND SYSTEM FOR MITIGATING RECEIVER SATURATION DURING SIMULTANEOUS FM TRANSMISSION AND RECEPTION

CROSS-REFERENCE TO RELATED APPLICATIONS/INCORPORATION BY REFERENCE

This application makes reference to, claims priority to, and claims the benefit of U.S. Provisional Application Ser. No. 60/895,698, filed on Mar. 19, 2007.

The above referenced application is hereby incorporated herein by reference in its entirety.

FIELD OF THE INVENTION

Certain embodiments of the invention relate to signal processing for communication systems. More specifically, certain embodiments of the invention relate to a method and system for mitigating receiver saturation during simultaneous FM transmission and reception.

BACKGROUND OF THE INVENTION

Electronic communication has become prolific over the last decade. While electronic communication was initially limited to the desktop, recent trends have been to make communications and the Internet available anytime, anywhere and, increasingly, on any device. Already now, it is quite common to find mobile devices such as cellular phones or Personal Digital Assistants (PDAs) that incorporate a large range of communication technologies and associated software. For example, fully-featured web-browsers, email clients, instant messenger software, and Voice-over-IP may all be found on some recent devices.

Along with this evolution towards increasingly portable and compact devices that support a multitude of communications standards, issues related to multi-standard operation and miniaturization have arisen. For example, devices operating both Bluetooth and Wireless LAN radios in the 2.4 GHz Industrial, Scientific and Medical (ISM) band may cause interference, be it because the transmission technologies are operated without coordination or because they may share some system components. Similar problems may be encountered with co-located FM system. In these systems, FM transmitters and FM receivers operate in close proximity and/or may share some system components. This may lead to interference issues since transmission and reception operate at similar frequencies. In particular, in some instances the FM transmitter power levels may drive the radio frequency front-end into saturation, thereby severely impacting reception quality.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for mitigating receiver saturation during simultaneous FM transmission and reception, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for mitigating receiver saturation during simultaneous FM transmission and reception. Aspects of the method and system for mitigating receiver saturation during simultaneous FM transmission and reception may comprise detecting a power of an RF signal received at an antenna. A power of one or more baseband signal components corresponding to the RF signal may be determined. A power of signals transmitted via the antenna may be controlled, based on a cost function derived from at least the detected RF signal power received and/or the determined power of the one or more baseband signal components.

One or more of the baseband signal components may be an in-phase signal, a quadrature signal or both an in-phase signal and a quadrature signal associated with a same carrier frequency. In one embodiment of the invention, the radio frequency signal may be an intermediate frequency (IF) radio signal. The cost function may be a function of a Bit Error Rate (BER), a Signal-to-Interference-and-Noise ratio (SINR) and/or a Packet Error Rate (PER). The RF signal may be demodulated and filtered and the power of the one or more baseband signal components may be determined by determining the power of the filtered demodulated RF signal. The demodulated RF signal may be filtered using a low-pass filter or a band-pass filter. The radio frequency signal may be demodulated by frequency translation with a carrier frequency, where the radio frequency signal may be multiplied by a signal at the carrier frequency.

Figure 1:
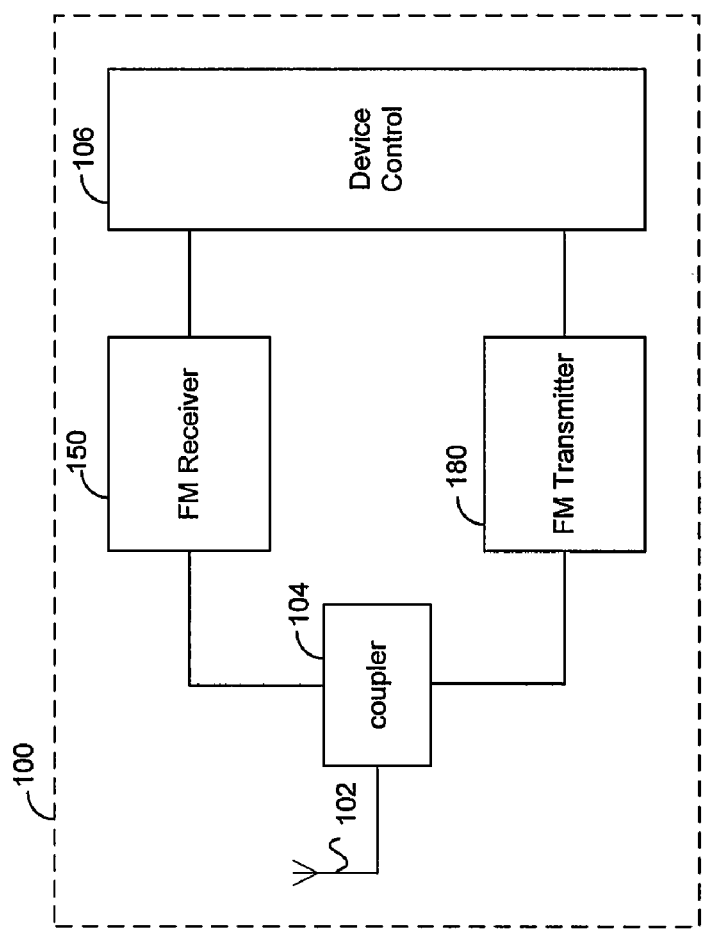
FIG. 1 is a block diagram illustrating an exemplary FM transceiver system, in accordance with an embodiment of the invention.

FIG. 1 is a block diagram illustrating an exemplary FM transceiver system, in accordance with an embodiment of the invention. Referring to FIG. 1, there is shown an FM transceiver system 100 comprising an antenna 102, a coupler 104, an FM receiver 150, an FM transmitter 180 and a device control 106.

The FM transceiver system 100 may comprise suitable logic, circuitry and/or code that may be enabled to transmit and receive FM signals simultaneously on different frequencies and/or in an alternating fashion on the same frequency. The FM transmitter 180 may comprise suitable logic, circuitry and/or code to enable generation of a transmit signal that may be communicated to the coupler 104. The FM receiver 150 may comprise suitable logic, circuitry and/or logic that may enable reception and/or processing of FM signals, fed to it from the coupler 104. The antenna 102 may be a shared antenna for a transmit signal path and a receive signal path. The transmit signal path from the FM transmitter 180 and the receive signal path to the FM receiver 150 may be coupled to the antenna 102 at the coupler 104 that may comprise suitable logic, circuitry and/or code to join the receive signal path and the transmit signal path, in order to communicatively couple a common signal path to antenna 102. A device control block 106 may comprise suitable logic, circuitry and/or code to enable controlling the FM transmitter 180 and the FM receiver 150. The control block 106 may control, for example, a gain and/or a demodulation frequency in the FM receiver 150 and, for example, a transmit power and frequency of the FM transmitter 180. The functionality of the device control block 106 may not be limited to the functionality described above.

Due to the coupling of the transmit signal path and the receive signal path in the coupler 104, the transmit signal path my leak into the receive signal path. This may lead to interference in the FM receiver 150 and/or may drive the FM receiver 150 into saturation, in particular its RF components.

Figure 2:
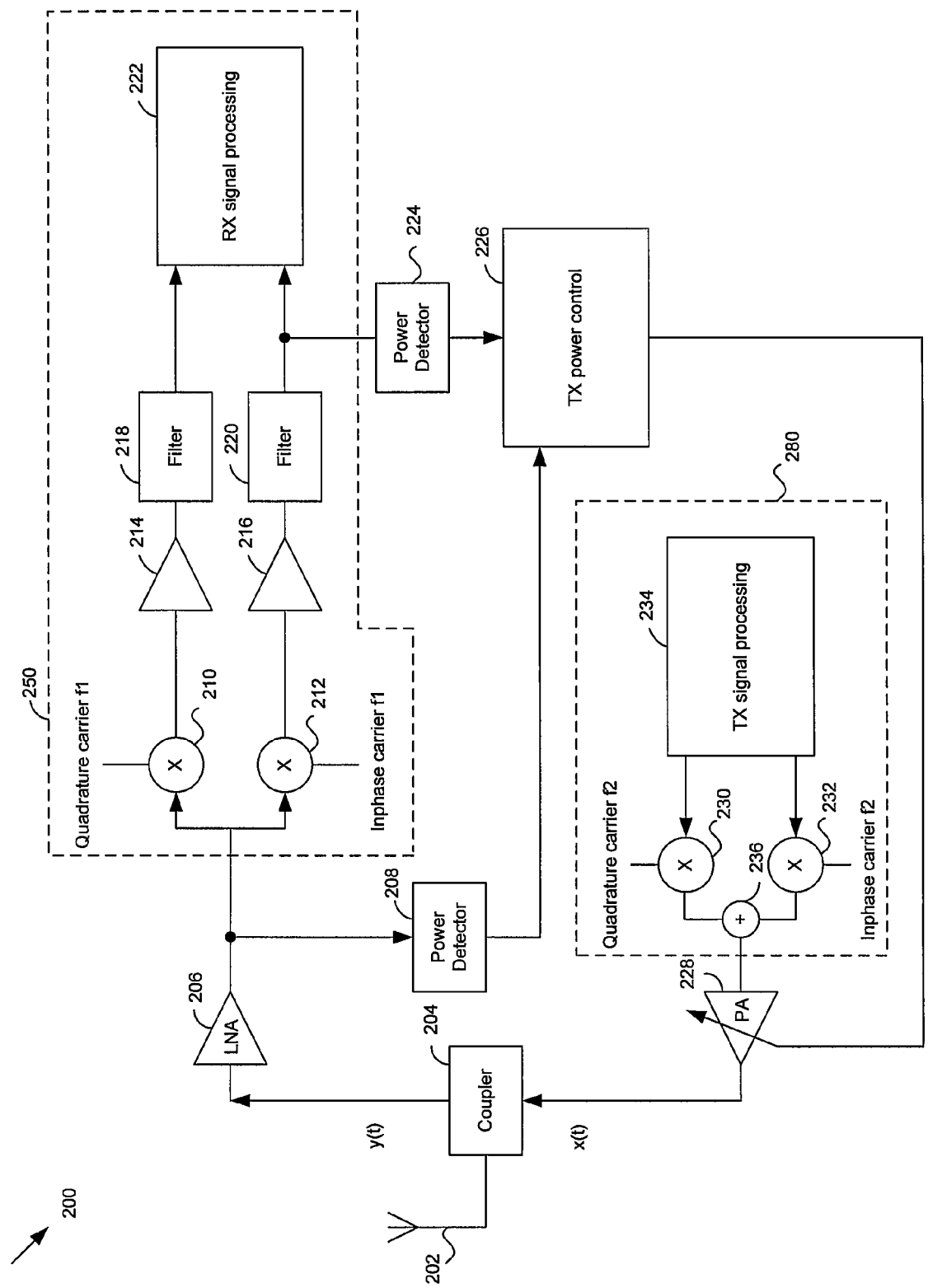
FIG. 2 is a block diagram illustrating an exemplary system that enables simultaneous FM transmitter and FM receiver with transmission power control, in accordance with an embodiment of the invention.

FIG. 2 is a block diagram illustrating an exemplary system that enables simultaneous FM transmitter and FM receiver with transmission power control, in accordance with an embodiment of the invention. Referring to FIG. 2, there is shown an antenna 202, a coupler 204, a low noise amplifier (LNA) 206, power detectors 208 and 224, a power amplifier (PA) 228, a receiver chain 250, a transmitter chain 280 and a TX power control block 226. The receiver chain 250 may comprise multipliers 210 and 212, amplifiers 214 and 216, filters 218 and 220, and an RX signal processing block 222. The transmitter chain 280 may comprise multipliers 230 and 232, adder 236, and TX signal processing block 234. There is also shown a transmit signal x(t), a receive signal y(t), in-phase carriers f1 and f2 and quadrature carriers f1 and f2. The transmit signal may be modulated onto a carrier frequency f2. The receive signal may be modulated onto a carrier frequency f1.

The antenna 202 may be coupled to the coupler 204. The coupler 204 may comprise suitable logic, circuitry and/or code that may be enabled to allow the antenna 202 to be coupled to both the transmit signal x(t) and the receive signal y(t).

The LNA 206 may comprise suitable logic, circuitry and/or code that may enable amplification of an input or received signal y(t). The output of the LAN 206 may be coupled to the receiver chain 250 and the power detector 208. The received signal y(t), after being amplified by the LNA 206, may be communicatively coupled to the receiver chain 250 for demodulating and further processing, for example, filtering. Demodulation may be achieved in separate signal branches for a quadrature signal and an in-phase signal. The receive chain 250 and in particular the RX signal processing block 222 may not be limited to the above described functionality.

The power detector 208 may comprise suitable logic, circuitry and/or code that may enable the power in the signal at its input to be determined. The output of the power detector 208 may be fed to the TX power control block 226. The TX power control block 226 may comprise suitable logic, circuitry and/or logic that may be enabled to control the transmission power of the signal x(t) by varying the gain of the power amplifier 228, based on at least one or both of the input signals to the TX power control block 226 from the power detector 208 and/or the power detector 224.

The multiplier 210 may comprise suitable logic, circuitry and/or code that may be enabled to demodulate the quadrature signal. The multiplier 210 may be enabled to multiply the amplified received signal with a quadrature carrier at frequency f1 in order to frequency translate the quadrature component of the received signal to baseband. The output of the multiplier 210 may be coupled to an amplifier 214. The output of the amplifier 214 may be coupled to an input of the filter 218.

The filter 218 may comprise suitable logic, circuitry and/or logic that may be enabled to receive as an input signal, an output of the amplifier 214, and low-pass filter this input signal in order to reject undesired signal components. The output of the filter 218 may be coupled to the RX signal processing block 222

The RX signal processing block 222 may comprise logic, circuitry and/or code to enable further processing of the quadrature baseband signal. The multiplier 212, amplifier 216 and filter 220 may be substantially similar to multiplier 210, amplifier 214 and filter 218. The in-phase signal may be demodulated, however, by multiplication with an in-phase carrier at frequency f1 at multiplier 212.

The TX signal processing block 234 may comprise suitable logic, circuitry and/or code, which may be enabled to generate a baseband quadrature signal and a baseband in-phase signal may be generated and fed to modulation multipliers 230 and 232, respectively. The quadrature baseband signal may be multiplied by a quadrature carrier at frequency f2 in multiplier 230, in order to frequency translate the baseband signal to a radio transmission frequency. Similarly, the in-phase baseband signal may be multiplied with an in-phase carrier at frequency f2 in multiplier 232. The in-phase and quadrature radio frequency components may be added in adder 236. The output of adder 236 may be coupled to power amplifier 228.

The power amplifier 228 that may comprise suitable logic, circuitry and/or code that may enable amplification of the RF signal before the RF signal may be communicated to the antenna 202 via the coupler 204.

Typically, some of the transmit signal x(t) centered at transmission frequency f2 may leak into the received signal y(t). The desired signal in y(t) may be at frequency f1 and f1 may typically be different from f2. In these instances, the signal contribution at frequency f2 comprised in y(t) due to the transmit signal x(t) may generate interference in the receive chain 250. In particular, the signal component at frequency f2 may be strong enough to saturate the amplifiers 214 and/or 216 and cause non-negligible interference with the desired signal component at frequency f1. In some instances, the interference may be mitigated by reducing the transmission power of the transmit signal x(t). This may be achieved by reducing the gain of the power amplifier 228.

The TX power control block 226 may comprise suitable logic, circuitry and/or code that may be enabled to control the gain of PA 228. The TX power control block 226 may control the PA 228 based on the outputs of the power detector 208 and 224 that may detect the signal power at the output of the LNA 206 and after the filter 220, respectively. The output of the power detectors 208 and 224 may be, for example, in decibels to enable a larger dynamic range. The invention, however, may not be limited to any particular output format. Accordingly, in various other exemplary embodiments of the invention, the power detector 224 may be coupled to the output of filter 218 and measure the signal power at frequency f1 in the quadrature component of the demodulated receive signal. In another embodiment of the invention, an additional power detector may be coupled to the output of filter 218 and measure the signal power at frequency f1 in the quadrature component of the demodulated receive signal, so that the signal power may be measured at power detector 224 and an additional power detector after filter 218. In these instances, the output of the additional power detector may be coupled to the TX control block 226.

Figure 3:
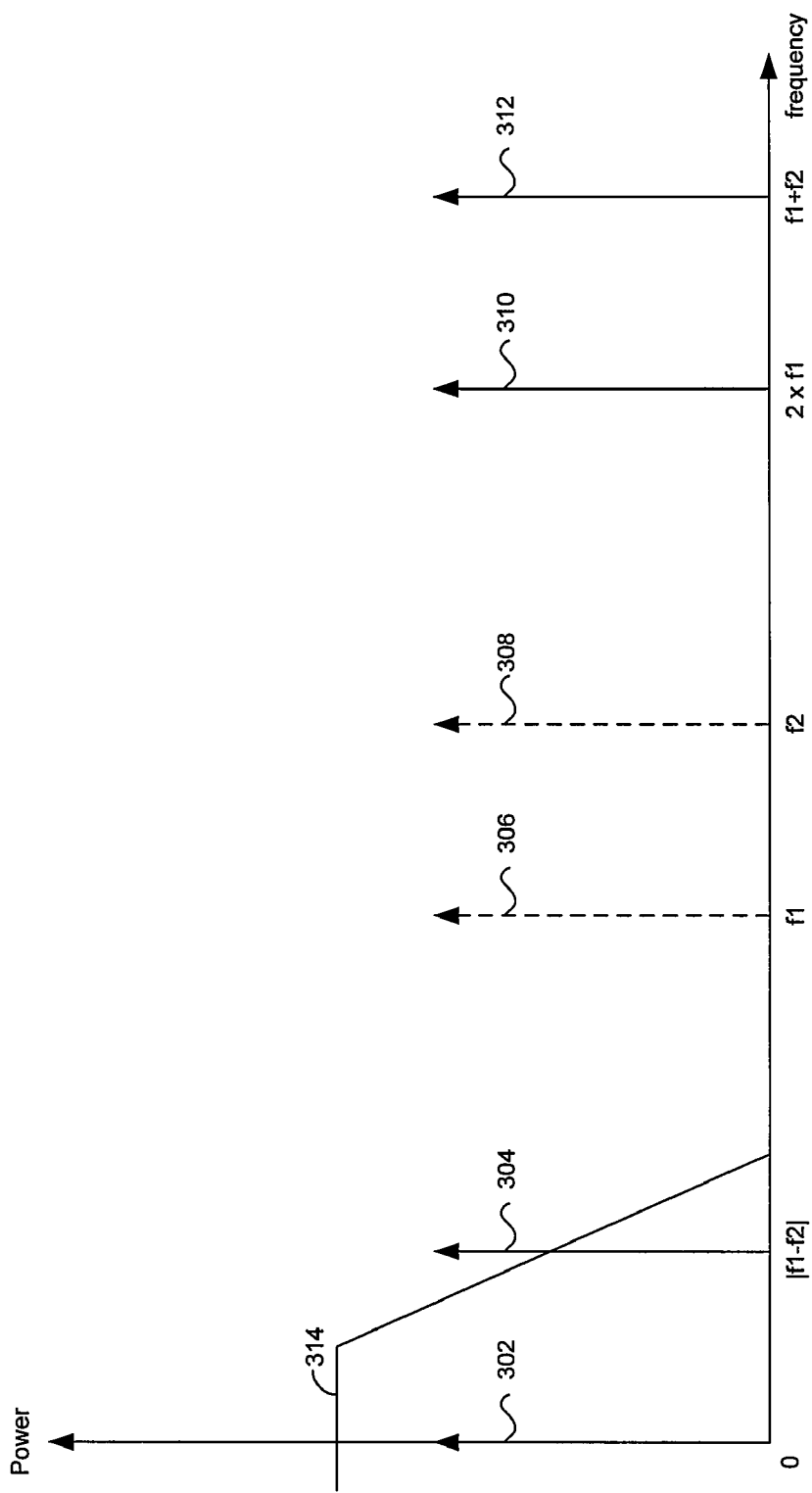
FIG. 3 is an exemplary power-frequency plot of a receive signal, in accordance with an embodiment of the invention.

FIG. 3 is an exemplary power-frequency plot of a receive signal, in accordance with an embodiment of the invention. Referring to FIG. 3, there is shown a baseband component 302, a difference component 304, an f1 component 306, an f2 component 308, a double component 310, a sum component 312 and a filter characteristic 314. There is also shown a frequency axis and a power axis. Although the signal at each of the above frequency components may be of finite bandwidth, only the carrier typically corresponding to the center frequency may be depicted in FIG. 3, for clarity.

A transmit signal x(t) as shown in FIG. 2 may be, for example, given by the following relationship:

$$x(t)=s_2(t)\cos(2\pi f_2 t)=s_2(t)\cos(w_2 t)$$

where $s_2(t)$ may represent an in-phase component of the signal modulated onto the carrier at frequency f2, and $w_2=2\pi f_2$ may be the angular frequency. In an exemplary embodiment of the invention, the signal x(t) may comprise an in-phase component only. Although not shown, a quadrature component may also be present. Furthermore, a desired signal component $s_1(t)\cos(w_1 t)$ at carrier frequency f1 may be comprised in the received signal y(t). Similarly to the transmitted signal, the signal y(t) may comprise an in-phase component at frequency f1 only. Although not shown, the quadrature component may also be present.

Since the transmit signal and the receive signal may be coupled to the same antenna 202 via a coupler 204, as illustrated in FIG. 2, some portion of the transmit signal x(t) may leak through the coupler 204 into the received signal y(t). The received signal y(t) may hence be written by the following relationship:

$$y(t)=s_1(t)\cos(w_1 t)+s_2(t)\cos(w_2 t)$$

where the component at f1 (w1) may be the desired receive signal. In FIG. 3, the f1 component 306 and f2 component 308 may depict the signal components of y(t). After amplification of the signal y(t) by the LNA 206, which may have an exemplary gain of unity in one embodiment of the invention, the amplified signal y(t) may be fed to the power detector 208. The power detector 208 may, for example, approximate the signal power of y(t) by computing approximately $$P_{208} \approx \frac{1}{T}\int_{t=0}^{T}|y(t)|^2,$$

that is, by integrating the input signal amplitude squared over a certain time interval. $P_{208}$ may in general provide an approximation of the signal power of y(t), but may not permit to distinguish how much of the signal power may be due to the desired component at frequency f1 and/or the interfering component at frequency f2. Notwithstanding, in instances where $P_{208}$ may attain levels that may drive or risk driving the receive chain 250 and in particular the amplifiers 214 and 216 as well as the RX sigma processing block 222 into saturation, the TX power control block 226 may reduce the transmission power at the PA 228. However, in some instances, it only a small part of $P_{208}$ may be due to x(t) leaking into y(t). This may typically not be detected directly by power detector 208, as mentioned above. For this reason, at least a second power detector 224 may be employed, which may detect the signal component primarily due to the desired signal component at frequency f1.

The amplified signal y(t) may be multiplied with an in-phase carrier at frequency f1 at the multiplier 212 for demodulation of the desired signal component f1 to baseband. After demodulation and an exemplary gain of 2 at the amplifier 216, the signal at the entry to filter 220 may be given by approximately the following relationship:

$$2 \cdot \cos(w_1 t) \cdot y(t) = s_1(t)\cos^2(w_1 t) + s_2(t)\cos(w_2 t)\cos(w_1 t)$$
$$= s_1(t) + s_1(t)\cos(2w_1 t) + s_2(t)\cos((w_1-w_2)t) +$$
$$s_2((w_1+w_2)t)$$

Hence, it may be seen that the signal may be composed of a desired component baseband component 302 ($s_1(t)$), a double (frequency) component 310 and interfering components due to x(t) at a difference component 304 and a sum component 312, as depicted in FIG. 3. Ideally, the filter 220 may eliminate all frequency components other than the baseband component 302. However, since the modulation signal $s_1(t)$ may possess a finite bandwidth around the baseband component 302 and the filter 220 may be non-ideal, that is with a finite slope, the exemplary filter characteristics of the filter 220 may be similar to the low-pass filter characteristics 314 in FIG. 3. Hence, the baseband component 302 may pass essentially non-attenuated and typically the double component 310 and the sum component 312 may be strongly attenuated. The difference component 304 may cause non-negligible interference, however, depending on at least the difference between the transmit frequency f2 and the receive frequency f1 and the filter characteristics 314. Nonetheless, as may be seen from FIG. 3, the signal after the filter 220 may be dominated by the desired signal component at frequency f1. This filtered signal may be fed to a power detector 224 that may determine the approximate signal power at frequency f1. Hence, the TX power control block 226 may be fed approximately the power due to the signal at frequency f1 from power detector 224, and the power due to both components at frequency f1 and f2 from power detector 208. Hence, the TX power control block 226 may determine how much signal may be due to the transmission signal x(t). Based on the interference generated by x(t), the TX power control block 226 may reduce or increase the gain of power amplifier 228 to ensure sufficiently high signal quality in the receive chain 250.

Figure 4:
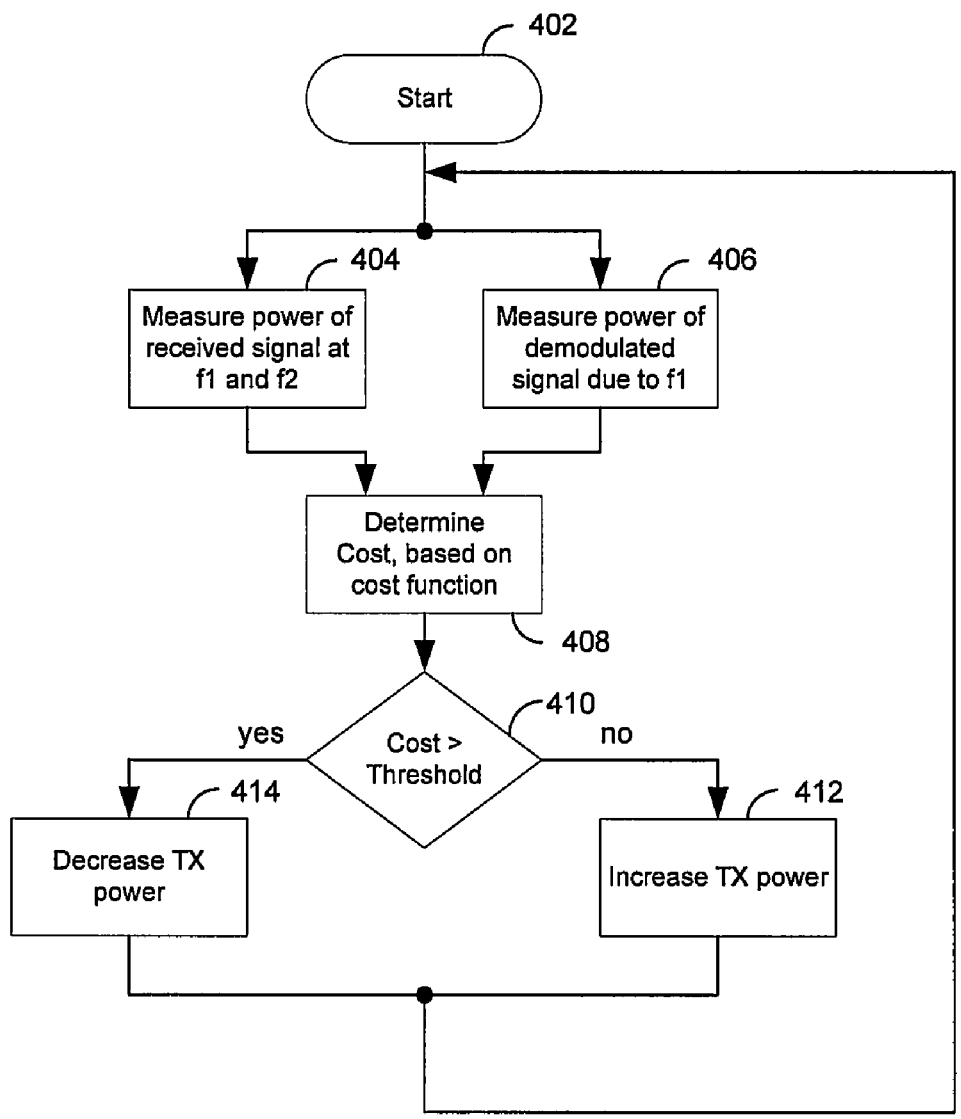
FIG. 4 is a flow chart illustrating an exemplary transmit power control algorithm, in accordance with an embodiment of the invention.

FIG. 4 is a flow chart illustrating an exemplary transmit power control algorithm, in accordance with an embodiment of the invention. In step 404, the power of the received signal may be measured. The measured signal power may comprise a signal contribution due to a desired signal at a frequency f1 and a component due to a transmit signal at a frequency f2, that may leak into the receive signal. The transmit signal may leak into the receive signal, for example, at a common coupler that may couple the receive signal path and the transmit signal path to a common antenna. In step 406, the power of the demodulated signal in baseband that may primarily comprise signal components due to the desired receive signal at frequency f1 may be measured. By measuring the signal power after demodulation and low-pass filtering, the power measured in step 406 may be approximately equal to the power due to the desired signal at frequency f1.

In step 408, which may be implemented at the TX power control block 226, a cost function may be used to compute a cost of interference, based on the power measurements obtained in steps 404 and 406. The cost may be high if a lot of interference may be present, whereas the cost may be low if little interference due to the transmit signal, for example x(t)

as shown in FIG. 3, may be present. In another embodiment of the invention, a cost function may be based on alternative measures and/or a combination with power measurements. For example, power measurements may be combined with Signal-to-Interference-plus-Noise (SINR), Bit Error Rate (BER) or Packet Error Rate (PER) measurements to determine a cost of interference based on a cost function. If, in step 410, the cost obtained in step 408 is greater than some threshold, the transmit power may be reduced in step 414. Else, if the cost does not exceed the threshold in step 410, the transmit power may be increased in step 412. One embodiment of the invention may hence provide maximum transmit power while maintaining sufficiently low cost of interference. In another embodiment of the invention, it may be sufficient to only decrease the transmit power if required, while not increasing transmit power beyond its initially assigned value.

In accordance with an embodiment of the invention, a method and system for mitigating receiver saturation during simultaneous FM transmission and reception may comprise detecting a power of an RF signal received at an antenna 202 in a power detector 208. A power of one or more baseband signal components corresponding to the RF signal may be determined in a power detector 224, as illustrated in FIG. 2. A power of signals transmitted via the antenna 202 may be controlled, for example in PA 228, based on a cost function derived from at least the detected RF signal power received and detected in power detector 208 and/or the determined power of the one or more baseband signal components, determined in power detector 224, as illustrated in FIG. 2 and FIG. 3. The power control may, for example, be performed in the TX power control block 226.

One or more of the baseband signal components may be an in-phase signal such as the signal after filter 220, a quadrature signal such as the signal after filter 218 or both an in-phase signal and a quadrature signal associated with a same carrier frequency, for example f1 in FIG. 2. In one embodiment of the invention, the radio frequency signal may be an intermediate frequency (IF) radio signal. The cost function may also be a function of a Bit Error Rate (BER), a Signal-to-Interference-and-Noise ratio (SINR) and/or a Packet Error Rate (PER). The RF signal may be demodulated and filtered, for example in receive chain 250, and the power of the one or more baseband signal components may be determined in power detector 224 by determining the power of the filtered demodulated RF signal. The demodulated RF signal may be filtered, for example in filter 218 or 220, using a low-pass filter or a band-pass filter. The radio frequency signal may be demodulated by frequency translation with a carrier frequency, for example f1, where the radio frequency signal may be multiplied by a signal at the carrier frequency, for example at multiplier 212.

Another embodiment of the invention may provide a machine-readable storage, having stored thereon, a computer program having at least one code section executable by a machine, thereby causing the machine to perform the steps as described herein for mitigating receiver saturation during simultaneous FM transmission and reception.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
   detecting a power of an RF signal received at an antenna;
   determining power of one or more baseband signal components corresponding to said RF signal; and
   controlling power of signals transmitted via said antenna based on a cost function derived from at least: said detected RF signal power received, and said determined power of said one or more baseband signal components.

2. The method according to claim 1, wherein said one or more baseband signal component is an in-phase signal.

3. The method according to claim 1, wherein said one or more baseband signal component is a quadrature signal.

4. The method according to claim 1, wherein said one or more baseband signal component is an in-phase signal component and a quadrature signal component, both of which are associated with a same carrier frequency.

5. The method according to claim 1, wherein said radio frequency signal may be an intermediate frequency (IF) radio signal.

6. The method according to claim 1, wherein said cost function is a function of a Bit Error Rate (BER).

7. The method according to claim 1, wherein said cost function is a function of a Signal-to-Interference-and-Noise ratio (SINR).

8. The method according to claim 1, wherein said cost function is a function of a Packet Error Rate (PER).

9. The method according to claim 1, comprising demodulating said RF signal.

10. The method according to claim 9, comprising filtering said demodulated RF signal.

11. The method according to claim 10, comprising determining said power of one or more baseband signal components by determining the power of said filtered demodulated RF signal.

12. The method according to claim 10, comprising filtering said demodulated RF signal using a low-pass filter.

13. The method according to claim 10, comprising filtering said demodulated RF signal using a band-pass filter.

14. The method according to claim 9, comprising demodulating said radio frequency signal by frequency translation with a carrier frequency.

15. The method according to claim 14, comprising multiplying said radio frequency signal by a signal at said carrier frequency for said frequency translation.

16. A system for processing communication signals, the system comprising:
one or more circuits, said one or more circuits enable:
 detection of a power of an RF signal received at an antenna;
 determination of power of one or more baseband signal components corresponding to said RF signal; and
 control of power of signals transmitted via said antenna based on a cost function derived from at least: said detected RF signal power received, and said determined power of said one or more baseband signal components.

17. The system according to claim 16, wherein said one or more baseband signal component is an in-phase signal.

18. The system according to claim 16, wherein said one or more baseband signal component is a quadrature signal.

19. The system according to claim 16, wherein said one or more baseband signal component is an in-phase signal component and a quadrature signal component, both of which are associated with a same carrier frequency.

20. The system according to claim 16, wherein said radio frequency signal may be an intermediate frequency (IF) radio signal.

21. The system according to claim 16, wherein said cost function is a function of a Bit Error Rate (BER).

22. The system according to claim 16, wherein said cost function is a function of a Signal-to-Interference-and-Noise ratio (SINR).

23. The system according to claim 16, wherein said cost function is a function of a Packet Error Rate (PER).

24. The system according to claim 16, wherein said one or more circuits demodulate said RF signal.

25. The system according to claim 24, wherein said one or more circuits filter said demodulated RF signal.

26. The system according to claim 25, wherein said one or more circuits determine said power of one or more baseband signal components by determining the power of said filtered demodulated RF signal.

27. The system according to claim 25, wherein said one or more circuits comprise a low-pass filter that filter said demodulated RF signal.

28. The system according to claim 25, wherein said one or more circuits comprise a band-pass filter that filter said demodulated RF signal.

29. The system according to claim 24, wherein said one or more circuits demodulate said radio frequency signal by frequency translation with a carrier frequency.

30. The system according to claim 29, wherein said one or more circuits multiply said radio frequency signal by a signal at said carrier frequency for said frequency translation.

* * * * *